(12) United States Patent
Akahori et al.

(10) Patent No.: US 9,632,110 B2
(45) Date of Patent: Apr. 25, 2017

(54) SEMICONDUCTOR ELEMENT INSPECTION DEVICE AND INSPECTION METHOD

(71) Applicant: Honda Motor Co. Ltd., Tokyo (JP)

(72) Inventors: Shigeto Akahori, Tochigi (JP); Shinyu Hirayama, Tochigi (JP); Hiroyuki Yamagishi, Tochigi (JP); Yoko Yamaji, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 13/966,804

(22) Filed: Aug. 14, 2013

(65) Prior Publication Data

US 2014/0125373 A1    May 8, 2014

(30) Foreign Application Priority Data

Nov. 2, 2012    (JP) .................................. 2012-242845

(51) Int. Cl.
*G01R 1/067* (2006.01)
*G01R 31/28* (2006.01)

(52) U.S. Cl.
CPC ...... *G01R 1/06794* (2013.01); *G01R 31/2886* (2013.01)

(58) Field of Classification Search
USPC ............ 324/762.01, 762.05, 750.24, 759.02; 438/14, 15; 257/E21.521; 382/144, 145
See application file for complete search history.

(56) References Cited

U.S. PATENT DOCUMENTS

| | | | | |
|---|---|---|---|---|
| 5,644,245 A | * | 7/1997 | Saitoh ................ | G01R 1/06794 324/750.18 |
| 7,372,283 B2 | * | 5/2008 | Furukawa et al. ....... | 324/754.22 |
| 2004/0218808 A1 | * | 11/2004 | Prince ..................... | B23K 3/08 382/150 |
| 2007/0258636 A1 | * | 11/2007 | Kudou ............... | G01N 21/9501 382/149 |
| 2010/0225345 A1 | * | 9/2010 | Kim et al. .................... | 324/758 |

FOREIGN PATENT DOCUMENTS

| | | |
|---|---|---|
| JP | 62-079640 | 4/1987 |
| JP | 04-104043 | 4/1992 |
| JP | 2000-206148 | 7/2000 |
| JP | 2005-249693 | 9/2005 |
| JP | 2010-117251 | 5/2010 |

* cited by examiner

*Primary Examiner* — Melissa Koval
*Assistant Examiner* — Nashima Monsur
(74) *Attorney, Agent, or Firm* — Rankin, Hill & Clark LLP

(57) ABSTRACT

A semiconductor inspection device (1) equipped with a contacting unit (7) having a contacting side surface (7a) electrically contacting a semiconductor element (3), and which inspects the semiconductor element (3) by making the contacting unit (7) electrically contact the semiconductor element (3). The contacting side surface (7a) is provided with a plurality of projecting units (13), and the semiconductor element inspection device (1) is equipped with a hitting mark detecting unit (11) configured to detect hitting marks of the projecting unit (13) transferred to the semiconductor element (3) when the contacting side surface (7a) contacts the semiconductor element (3), and a control unit (17) configured to determine whether or not an inspection of the semiconductor element (3) is performed appropriately, on the basis of the hitting marks detected by the hitting mark detecting unit (11).

7 Claims, 5 Drawing Sheets

NORMAL

ABNORMAL

NORMAL

ABNORMAL

NORMAL

ABNORMAL

SEMICONDUCTOR ELEMENT INSPECTION DEVICE AND INSPECTION METHOD

BACKGROUND OF THE INVENTION

Field of the Invention

The present invention relates to an inspection device and an inspection method of a semiconductor element.

Description of the Related Art

Conventionally, there has been known an inspection device equipped with a plurality of probes that are arranged on a holder so as to be capable of advancing and retreating, and which inspects electric characteristics of a semiconductor element by making a plurality of the probes contact the semiconductor element (for example, refer to Japanese Patent application Laid-Open No. 2010-117251).

In the inspection device of the semiconductor element equipped with a plurality of the probes, each probe is fine, so that it is difficult to apply large current thereto. Therefore, in place of a plurality of the probes, it is conceivable to provide a contacting unit having a contacting side surface having small projections.

However, in a case of making the semiconductor element and a contacting unit plane contact, variation of a distribution of a pressure applied from the contacting unit to the semiconductor element tends to generate. Stated otherwise, there is a fear that a difference in the pressure from the contacting unit may occur, according to a location of the semiconductor element. When the pressure difference occurs, there is a possibility that large current flows locally, and this makes it impossible to appropriately inspect the semiconductor element. Therefore, even when the inspection device determines abnormality of the semiconductor element, there is a fear that it is not possible to determine whether this actually reflects the abnormality of the semiconductor element, or it is a result of abnormality on the inspection device side generated by the variation of the pressure distribution.

SUMMARY OF THE INVENTION

The present invention has been made in view of such background, and it is an object of the present invention to provide a semiconductor element inspection device and an inspection method, the semiconductor element inspection device being equipped with a contacting unit which plane contacts the semiconductor element, and which is capable of determining whether or not a variation of a pressure distribution is generated.

In order to achieve the above-mentioned object, the present invention is a semiconductor element inspection device including a contacting unit having a contacting side surface on a side electrically contacting a semiconductor element, and which electrically inspects the semiconductor element by making the contacting unit electrically contact the semiconductor element; wherein a plurality of projecting units are provided to the contacting side surface of the contacting unit, and the semiconductor element inspection device includes a hitting mark detecting unit configured to detect hitting marks of the projecting units that are transferred to the semiconductor element when the projecting units of the contacting unit is made to contact the semiconductor element for an inspection of the semiconductor element, and a determining unit configured to determine whether or not the inspection of the semiconductor element is performed appropriately, on a basis of the hitting mark detected by the hitting mark detecting unit.

According to the present invention, whether or not the variation in the distribution of the pressure by the contacting unit to the semiconductor element is generated may be determined by the determining unit on the basis of the hitting marks detected by the hitting mark detecting unit. Therefore, when it is determined by the determining unit that the variation in the pressure distribution is not generated, and in the case where the semiconductor element inspection device detects the abnormality of the semiconductor element, then it is found that the abnormality exists in the semiconductor element. On the other hand, when it is determined by the determining unit that the variation in the pressure distribution is generated, it is found that the semiconductor element is not appropriately inspected.

Further, in the present invention, the determining unit may be configured to determine that an appropriate inspection is performed, in a case where an area of the hitting mark detected by the hitting mark detecting unit is equal to or more than a predetermined area set based on the area of the projection unit; and determine that an inappropriate inspection is performed, in a case where the area of the hitting mark detected by the hitting mark detecting unit is less than the predetermined area.

Further, in the present invention, it may be configured so that the contacting side surface is formed in a rectangular shape, the hitting mark detecting unit respectively detects the hitting marks of four portions of the semiconductor element respectively corresponding to portions on four corners of the contacting side surface, and the determining unit is configured to determine whether or not the inspection of the semiconductor element is performed appropriately, by mutually comparing four hitting marks detected by the hitting mark detecting unit.

Further, an inspection method of a semiconductor element of the present invention includes an inspection process of inspecting a semiconductor element, by pressing a contacting unit comprising a contacting side surface having a plurality of projecting units to the semiconductor element, and making the projecting units contact the semiconductor element; a hitting mark detection process of detecting hitting marks of the projecting units transferred to the semiconductor element; and a determination process of determining whether or not an inspection of the semiconductor element is performed appropriately, based on the hitting mark detected by the hitting mark detection process.

According to the present invention, it is possible to determine whether or not the variation in the distribution of the pressure is generated to the semiconductor element by the contacting unit in the determination process. Therefore, when it is determined in the determination process that the variation in the pressure distribution is not generated, in the case where the abnormality of the semiconductor element is detected in the inspection process, then it is found that the abnormality exists in the semiconductor element. On the other hand, when it is determined in the determination process that the variation in the pressure distribution is generated, then it is found that the semiconductor element is not appropriately inspected in the inspection process.

Further, in the inspection method of the semiconductor element of the present invention, the determination process may compare an area of a part of the hitting marks detected in the hitting mark detection process with an area of a part of the other hitting marks, and determine that the inspection is performed appropriately when a difference of the areas is within a predetermined range.

According thereto, it is possible to determine whether or not there is a variation in the pressure distribution by the contacting unit is generated, without determining the area of all the hitting marks. Further, it is not necessary to store information of an area that serves as a reference of determination. Therefore, it becomes possible to simplify the determination operation.

Further, in the inspection method of the semiconductor element of the present invention, the determination process may determine by comparing a reference area preliminary stored in a storing unit, and an area of the hitting mark detected in the hitting mark detection process.

DESCRIPTION OF THE PREFERRED EMBODIMENTS

Figure 1:
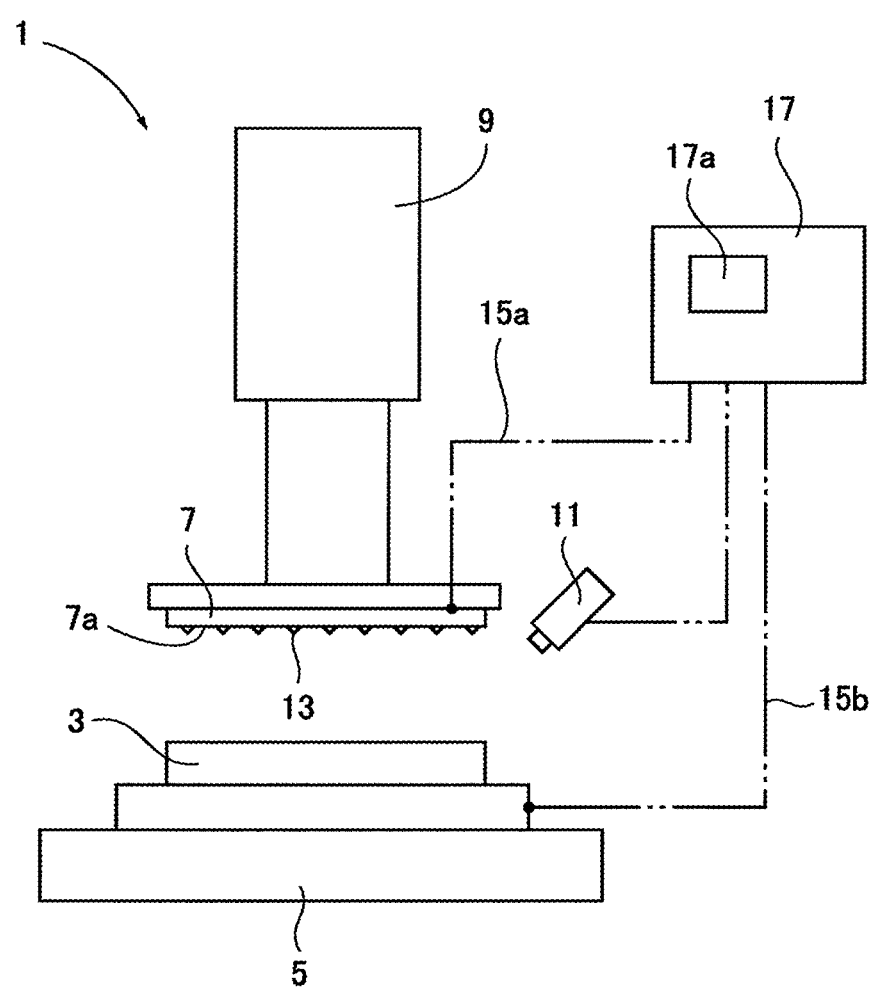
FIG. 1 is a frame format schematically showing one embodiment of a semiconductor element inspection device of the present invention.

An embodiment of a semiconductor element inspection device 1 and an inspection method of a semiconductor element of the present invention will be explained with reference to FIG. 1 through FIG. 4. As is shown in FIG. 1, the semiconductor element inspection device 1 of the present embodiment is equipped with a placement table 5 capable of placing a semiconductor element 3 thereon, a contacting unit 7 which is arranged above the semiconductor element 3, an elevating mechanism 9 capable of freely raising and lowering the contacting unit 7, and a hitting mark detecting unit 11 including a camera capable of freely capturing the semiconductor element 3 placed on the placement table 5.

Figure 2:
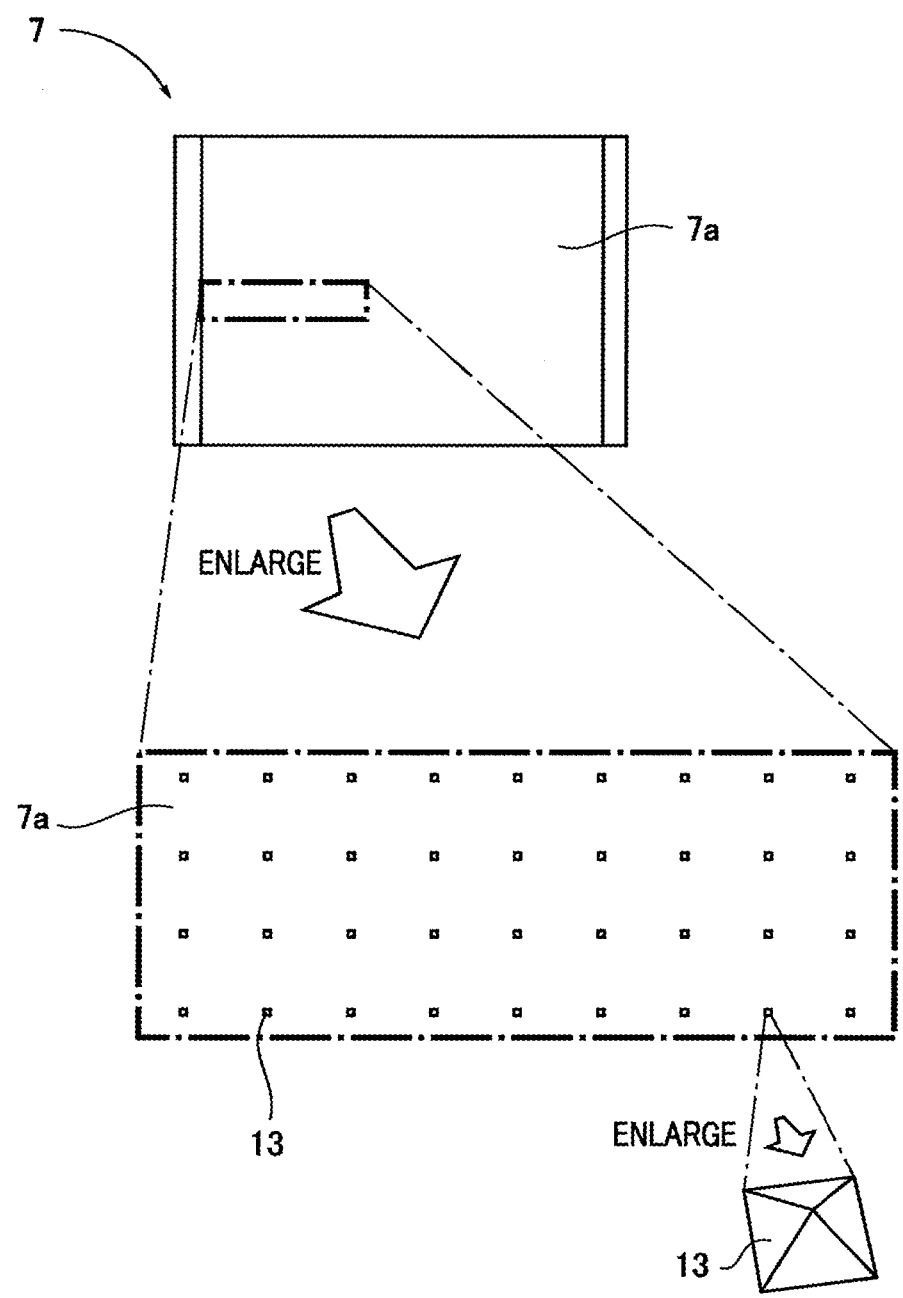
FIG. 2 is an explanatory view showing a contact side surface of a contacting unit of the present embodiment, and showing by enlarging a part of the contacting side surface and projections.

To a side of the semiconductor element 3 of the contacting unit 7, a contacting side surface 7a is provided. To the contacting side surface 7a, as is shown in FIG. 2, a plurality of projecting units 13 of a quadrangular pyramid-shape are provided with intervals therebetween. The interval between the projecting units 13 are set to equal interval. The shape of the projecting unit of the present invention is not limited to the quadrangular pyramid-shape.

Returning back to FIG. 1, to the placement table 5 and the contacting unit 7, a control unit 17 as a determining unit is connected via wirings 15a, 15b. Further, the control unit 17 is also connected to the hitting mark detecting unit 11, and is configured to be capable of receiving and analyzing images imaged by the hitting mark detecting unit 11. The control unit 17 is an electronic unit configured from a CPU, a memory, and the like, and executes a control program stored in the memory by the CPU. Further, the control unit 17 is equipped with a storing unit 17a, which stores an area of a hitting pattern 3a (refer to FIG. 4) of the projecting unit 13 transferred to the semiconductor element 3 when the contacting unit is pressed in a state where a pressure distribution is appropriate, which is preliminarily obtained by experiments, as a predetermined area (a reference area).

Next, with reference to FIG. 3, the inspection method of the semiconductor element 3 by the semiconductor element inspection device 1 of the present embodiment will be explained. First, the semiconductor element 3 is placed on the placement table 5. Thereafter, in STEP 1, the contacting unit 7 is lowered by the elevating mechanism 9, so as to make the same contact the projecting units 13 to an upper electrode of the semiconductor element 3. At this time, the projecting units 13 of the contacting unit 7 pierce an oxide film of the semiconductor element 3. Thereafter, the hitting marks 3a are formed on a surface of the semiconductor element 3. Thereafter, the semiconductor element 3 is electrified, and an inspection of electrical characteristics of the semiconductor element 3 is performed. Thereafter, the process proceeds to STEP 3, and the contacting unit 7 is raised by the elevating mechanism 9.

Subsequently, in STEP 4, the hitting mark detecting unit 11 images the upper electrode (the surface) of the semiconductor element 3. The control unit 17 receives imaged data from the hitting mark detecting unit 11, calculates a total of the area of the hitting marks 3a formed on the semiconductor element 3 from the received imaged data, and confirms whether or not the inspection had been performed normally.

Specifically, the contacting side surface 7a is formed in a rectangular shape, and as is shown in FIG. 4, the control unit 17 obtains the area of the hitting marks 3a from portions on four corners of the semiconductor element 3 corresponding to four corners of the contacting side surface 7a from the imaged data by the hitting mark detecting unit 11, and confirms whether or not the obtained area is equal to or more than the predetermined area (the reference area), which is set from the total of the area of the hitting marks of the portions on the four corners in the normal state preliminarily stored in the storing unit 17a provided in the control unit 17 while taking error into consideration. The control unit 17 determines that the inspection had been performed normally, if the obtained area is equal to or more than the predetermined area (the reference area). The control unit 17 determines that the inspection had been inappropriate, if the obtained area is less than the predetermined area (the reference area), since the pressure distribution of the contacting unit 7 has been varied, and normal inspection had not been performed.

According to the semiconductor element inspection device 1 of the present embodiment, whether or not a variation of the distribution of the pressure by the contacting unit 7 to the semiconductor element 3 is generated may be determined by the control unit 17 as the determining unit. Therefore, when it is determined by the control unit 17 that the variation of the pressure distribution is not generated, and in the case where the control unit 17 detects abnormality of the semiconductor element 3, then it is found that there is an abnormality exists in the semiconductor element 3 (the semiconductor element 3 is rejected by the inspection). On the other hand, when it is determined by the control unit 17 that the variation of the pressure distribution is generated, then it is found that the semiconductor element 3 had not been inspected appropriately.

Figure 3:
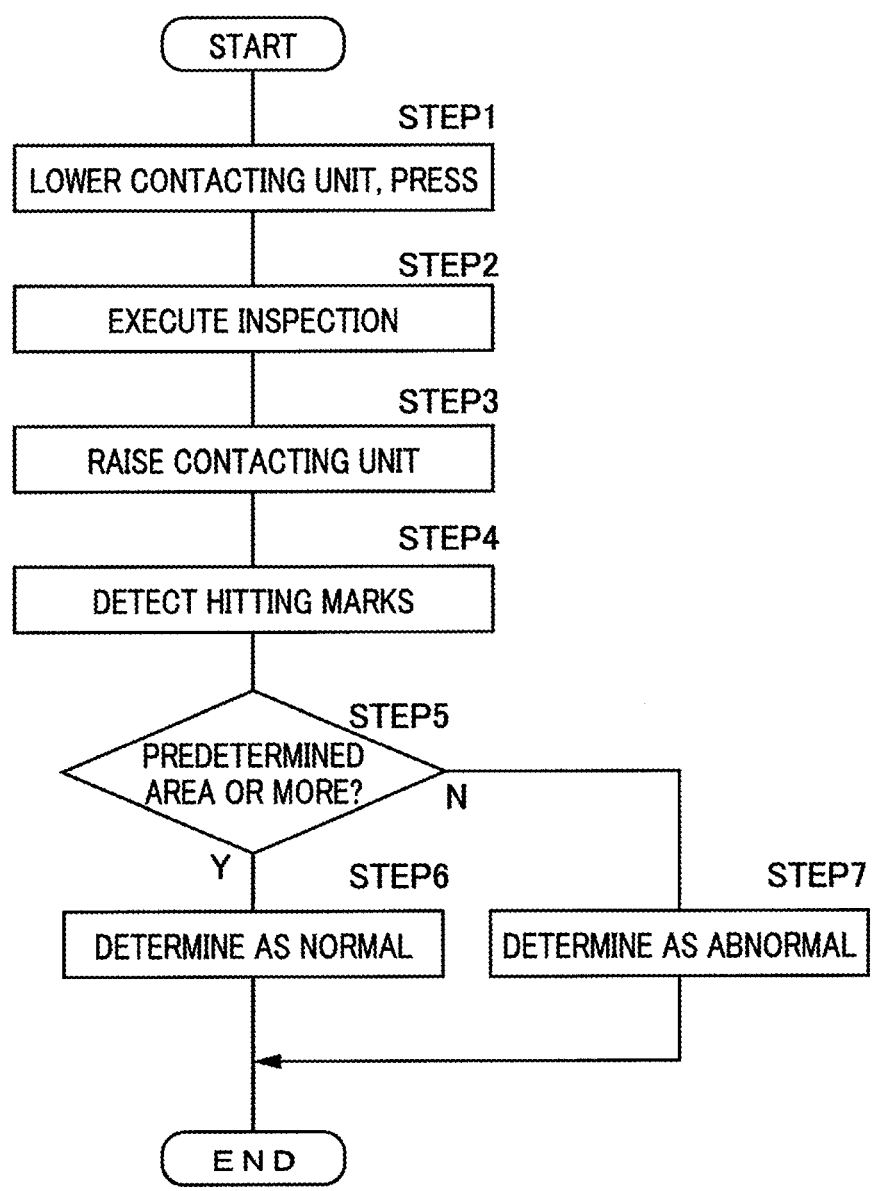
FIG. 3 is a flow chart showing an inspection method of the semiconductor element according to the present embodiment.
Figure 4A:
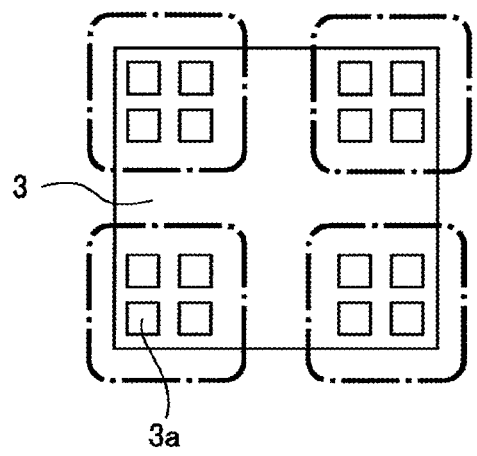
FIG. 4A is an explanatory view schematically showing a determination technique of the semiconductor element inspection device of the present embodiment, and shows a surface of the semiconductor element in the case where the inspection is performed in a normal state.
Figure 4C:
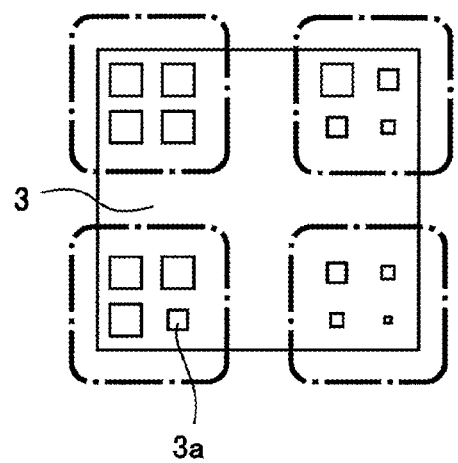
FIG. 4C is an explanatory view schematically showing the determination technique of the semiconductor element inspection device of the present invention, and shows the surface of the semiconductor element in the case where the inspection is performed in an abnormal state.
Figure 4B:
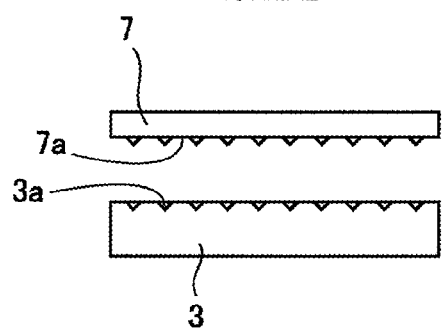
FIG. 4B is an explanatory view showing FIG. 4A from side thereof.
Figure 4D:
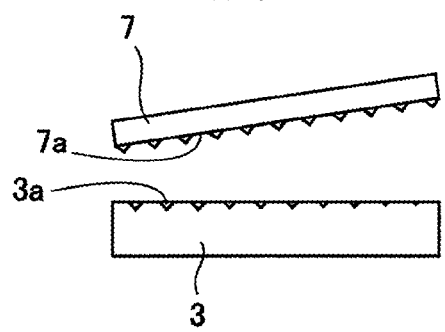
FIG. 4D is an explanatory view showing FIG. 4C from side thereof.

In the present embodiment, STEP 1 through STEP 3 in the flow chart of FIG. 3 are an inspection process, STEP 4 is a hitting mark detection process, and STEP 5 through STEP 7 are a determination process.

Figure 5A:
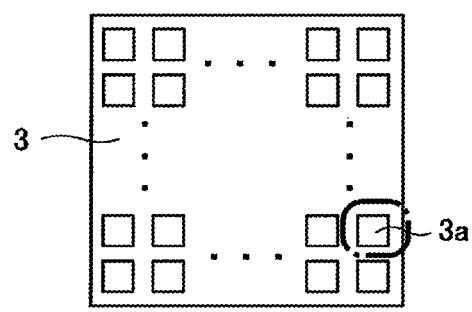
FIG. 5A is an explanatory view schematically showing the determination technique of the semiconductor element inspection device of another embodiment, and shows the surface of the semiconductor element in the case where the inspection is performed in the normal state.
Figure 5B:
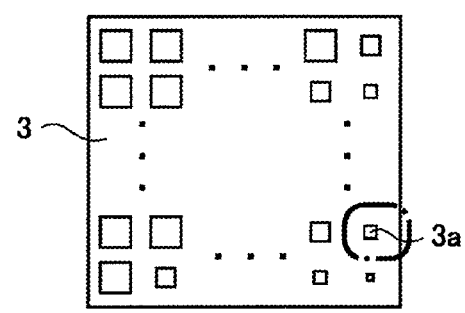
FIG. 5B is an explanatory view schematically showing the determination technique of the semiconductor element inspection device of another embodiment, and shows the surface of the semiconductor element in the case where the inspection is performed in the abnormal state.

In the present embodiment, as the determining unit, the one which determines pass-fail by comparing the area of the four corners respectively with a threshold value had been explained. However, the determining method of the determining unit is not limited thereto, and for example, as is shown in FIG. 5, may be configured to determine by whether or not the area of one hitting mark 3a is equal to or more than a predetermined area (a reference area) preliminarily obtained by experiments.

Further, the determining unit may be configured to mutually compare the total value of the area of the hitting marks 3a of the four corners of the semiconductor element 3, and determine whether or not a mutual difference of the total values of the area is within a predetermined range. In this case, the total value of the area of one of the hitting marks 3a corresponds to "an area of a part of the hitting marks" of the present invention, and the total value of the area of the other hitting marks 3a corresponds to "an area of a part of the other hitting marks" of the present invention.

Further, detecting location of the hitting marks of the present invention is not limited to the portions on the four corners of the semiconductor element, and may be set to arbitrary portion of the semiconductor element.

Still further, as the inspection method of the semiconductor element of the present invention, the hitting mark detection process may be performed by a visual perception of a human, and the determination process may be entrusted to a decision of the human.

What is claimed is:

1. A semiconductor element inspection device comprising a contacting unit having a contacting side surface on a side electrically contacting a semiconductor element, and which electrically inspects the semiconductor element by making the contacting unit electrically contact the semiconductor element; wherein
a plurality of projecting units are provided to the contacting side surface of the contacting unit, and
the semiconductor element inspection device comprises
a hitting mark detecting unit configured to detect a plurality of hitting marks of the projecting units that are transferred to the semiconductor element when the plurality of projecting units of the contacting unit are simultaneously made to contact the semiconductor element for an inspection of the semiconductor element, and
a determining unit comprising a CPU configured to determine whether or not the inspection of the semiconductor element is performed appropriately, based on the plurality of hitting marks detected by the hitting mark detecting unit, and
wherein the determining unit is configured to select a first group of hitting marks and a second group of hitting marks, as two different groups of hitting marks having a same predetermined number of hitting marks and a same area, among the plurality of hitting marks detected by the hitting mark detecting unit, and compare a first total area of the hitting marks included in the first group of hitting marks with a second total area of the hitting marks included in the second group of hitting marks, and determine that the inspection is performed appropriately when a difference of values of the first total area and the second total area is within a predetermined range which is stored in advance and that the inspection is performed inappropriately when the difference of values of the first total area and the second total area is out of the predetermined range.

2. The semiconductor element inspection device according to claim 1, wherein
the contacting side surface is formed in a rectangular shape,
the determining unit is configured to select four groups of hitting marks among the plurality of hitting marks detected by the hitting mark detecting unit, the four groups of hitting marks respectively corresponding to portions on four corners of the contacting side surface, the four groups of hitting marks including the first group of hitting marks and the second group of hitting marks, and
the determining unit is configured to determine whether or not the inspection of the semiconductor element is performed appropriately, by mutually comparing total areas of the hitting marks of each of the four groups of hitting marks.

3. An inspection method of a semiconductor element, comprising:
an inspection process of inspecting a semiconductor element, by pressing a contacting unit comprising a contacting side surface having a plurality of projecting units to the semiconductor element, and making the plurality of projecting units simultaneously contact the semiconductor element;
a hitting mark detection process of detecting a plurality of hitting marks of the projecting units transferred to the semiconductor element; and
a determination process of determining whether or not an inspection of the semiconductor element is performed appropriately, based on the plurality of hitting marks detected by the hitting mark detection process, by selecting a first group of hitting marks and a second group of hitting marks, as two different groups of hitting marks having a same predetermined number of hitting marks and a same area, among the plurality of hitting marks detected by the hitting mark detection process, and comparing a first total area of the hitting marks included in the first group of hitting marks, with a second total area of hitting marks included in the second group of hitting marks, and determining that the inspection is performed appropriately when a difference of values of the first total area and the second total area is within a predetermined range which is stored in advance and that the inspection is performed inappropriately when the difference of values of the first total area and the second total area is out of the predetermined range.

4. The semiconductor element inspection device according to claim 1, wherein each of the first and second groups of hitting marks is composed of a plurality of hitting marks adjacent to each other among the hitting marks detected by the hitting mark detecting unit.

5. The semiconductor element inspection device according to claim 1, wherein each of the first and second groups of hitting marks is a unique set of hitting marks among the hitting marks detected by the hitting mark detecting unit.

6. The inspection method of the semiconductor element according to claim 3, wherein each of the first and second groups of hitting marks is composed of a plurality of hitting marks adjacent to each other among the hitting marks detected by the hitting mark detection process.

7. The inspection method of the semiconductor element according to claim 3, wherein each of the first and second groups of hitting marks is a unique set of hitting marks among the hitting marks detected by the hitting mark detection process.

\* \* \* \* \*